US007616439B2

(12) United States Patent
Shimizu et al.

(10) Patent No.: US 7,616,439 B2
(45) Date of Patent: Nov. 10, 2009

(54) ELECTRIC CONNECTION BOX (75) Inventors: Tatsuya Shimizu, Yokkaichi (JP); Manabu Hashikura, Yokkaichi (JP); Futoshi Nishida, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 197 days.

(21) Appl. No.: 11/984,086

(22) Filed: Nov. 13, 2007

(65) Prior Publication Data
US 2008/0119068 A1   May 22, 2008

(30) Foreign Application Priority Data
Nov. 16, 2006  (JP)  ............................. 2006-310652

(51) Int. Cl.
*H05K 7/20* (2006.01)
(52) U.S. Cl. ...................................... 361/694
(58) Field of Classification Search ................. 361/694, 361/695, 679.46, 679.49; 439/487; 174/50, 174/15.1, 52.4; 165/104.33
See application file for complete search history.

(56) References Cited

U.S. PATENT DOCUMENTS

| 5,474,475 | A  | * | 12/1995 | Yamaguchi | ............ | 439/620.27 |
| 7,248,472 | B2 | * | 7/2007 | Vinson et al. | ................ | 361/694 |
| 7,349,208 | B2 | * | 3/2008 | Marumoto, Takeshi | ..... | 361/690 |
| 7,450,377 | B2 | * | 11/2008 | Matsumoto et al. | .... | 361/679.48 |
| 2004/0159455 | A1 | * | 8/2004 | Onizuka et al. | ................ | 174/50 |
| 2007/0281506 | A1 | * | 12/2007 | Wang et al. | ................... | 439/70 |

FOREIGN PATENT DOCUMENTS

| JP | A-09-214158 | 8/1997 |
| JP | A-2000-036679 | 2/2000 |
| JP | A-2001-197628 | 7/2001 |
| JP | A-2001-298290 | 10/2001 |
| JP | A-2005-295724 | 10/2002 |
| JP | A-2006-019711 | 1/2006 |

OTHER PUBLICATIONS

U.S. Appl. No. 11/984,084, filed Nov. 13, 2007 in the name of Manabu Hashikura.
U.S. Appl. No. 11/984,083, filed Nov. 13, 2007 in the name of Tatsuya Shimizu et al.
Masaru Ishizuka; "A Thermal Design Approach for natural Air Cooled Electronic Equipment Casings", HTD-vol. 303, 1995, National Heat Transfer Conference, vol. 1, ASME 1995.

* cited by examiner

*Primary Examiner*—Chandrika Prasad
(74) *Attorney, Agent, or Firm*—Oliff & Berridge, PLC (57) ABSTRACT One aspect of the present invention can include an electric connection box having a circuit board, a case inside of which said circuit board is housed, a plurality of fitting depressions capable of being fitted with an external electrical component, positioned on a side wall of the case opposing a board surface of the circuit board. Further, an air path inside of said case is defined by the plurality of fitting depressions positioned as an arrayed side by side with a spacing in between, and the air path circulates the air up and down between the plurality of fitting depressions, and an inlet positioned in the case and in communication with the air path, an exhaust outlet is positioned in the case in communication with the air path and positioned above said inlet, and a heat generating component is positioned in the air path.

15 Claims, 8 Drawing Sheets

ELECTRIC CONNECTION BOX

CROSS REFERENCE TO RELATED APPLICATION

This application claims priority from Japanese Patent Application No. 2006-310652 filed Nov. 16, 2006. The entire content of this priority application is incorporated herein by reference.

FIELD OF THE INVENTION

The present invention relates to an electric connection box, comprising a circuit board housed inside of a case.

DESCRIPTION OF THE RELATED ART

Literature 1 (Japanese Unexamined Patent Application Publication No. 2001-197628) has been known as a conventional electric connection box. The electric connection box according to Literature 1 houses a circuit board in which an electronic component is mounted inside of a case. The case is composed of a lower case and an upper case to be assembled so as to cap the lower case. In the upper case, a connector housing having a shape protruding in and out of the upper case is formed.

The above-mentioned electronic component produces heat when energized. According to the conventional electric connection box, the heat from the electronic component would be diffused into of the case, then be diffused out from the wall of the case.

However, in these days, density growth of the electric connection box is required. This increases the number of relays to be housed inside of the case, thereby tending to increase the heating value produced from the relays on the whole. Furthermore, downsizing of the electric connection box is also required, and thus, the volume inside of the case is tending to reduce. Therefore, the heat produced from the relays is concerned to remain in the case and cause the temperature increase inside of the case. High temperature inside of the case might decrease the performance of the electronic component mounted in the circuit board.

Considering the foregoing, external air may inflow from an air hole provided in the case. However, when the connector housing is formed inside of the case like the conventional example, such connector housing has a shape protruding into the case. This complicates the shape of the inside of the case, thereby disturbing the air flow therein. It is therefore difficult to sufficiently cool the electronic component.

The present invention has been made on the basis of the above circumstances, with an object of providing an electric connection box with improved radiation performance.

SUMMARY OF THE INVENTION

One aspect of the present invention can include an electric connection box having a circuit board, a case inside of which said circuit board is housed, a plurality of fitting depressions capable of being fitted with an external electrical component, positioned on a side wall of the case opposing a board surface of the circuit board. Further, an air path inside of said case is defined by the plurality of fitting depressions positioned as an arrayed side by side with a spacing in between, and the air path circulates the air up and down between the plurality of fitting depressions, and an inlet positioned in the case and in communication with the air path, an exhaust outlet is positioned in the case in communication with the air path and positioned above said inlet, and a heat generating component is positioned in the air path.

According to the present invention, the air inflowing into the case from the inlet contacts with the heat generating component arranged inside of the air path, so that the heat produced from the heat generating component is transmitted to the air. Then, the density of the air decreases because of the raised temperature of the air, and thus the chimney effect causes the air climbing up inside of the air path. And then, the outflow of this air from the exhaust outlet enables the heat produced from the heat generating component to be exhausted to the outside of the case. Consequently, the radiation performance of the electric connection box can be improved.

BRIEF DESCRIPTION OF THE DRAWINGS

Illustrative aspects in accordance with the invention will be described in detail with reference to the following figures wherein.

DETAILED DESCRIPTION OF THE PREFERRED ILLUSTRATIVE ASPECTS

Figure 4:
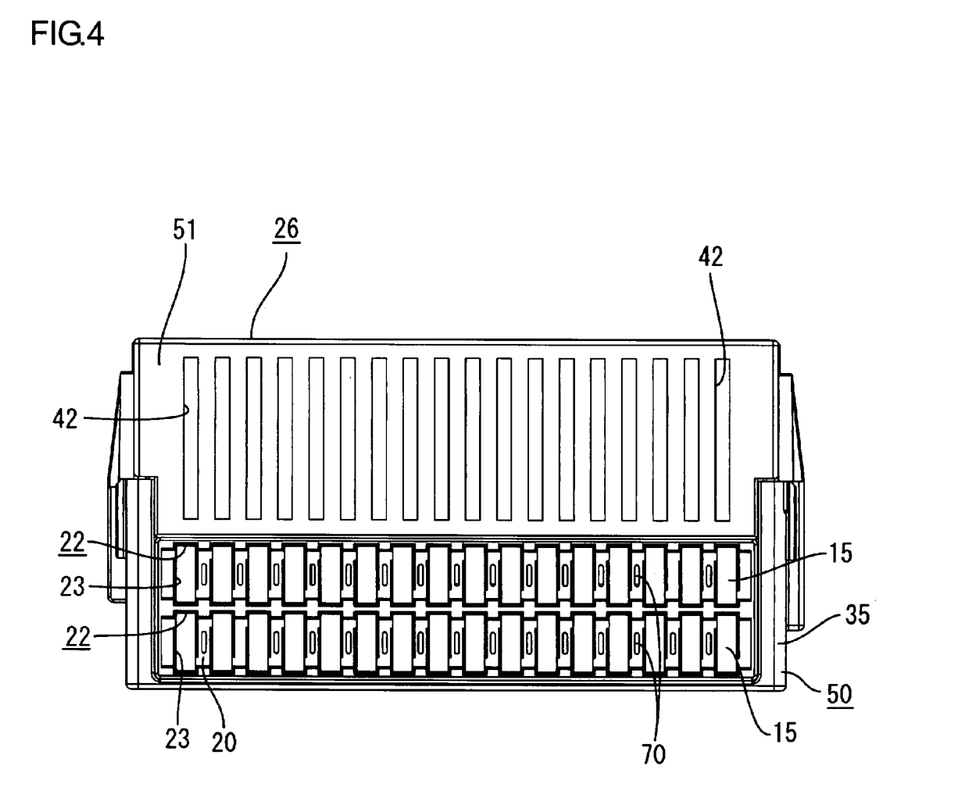
FIG. 4 shows a bottom view of an electric connection box according to one illustrative aspect of the present invention.
Figure 5:
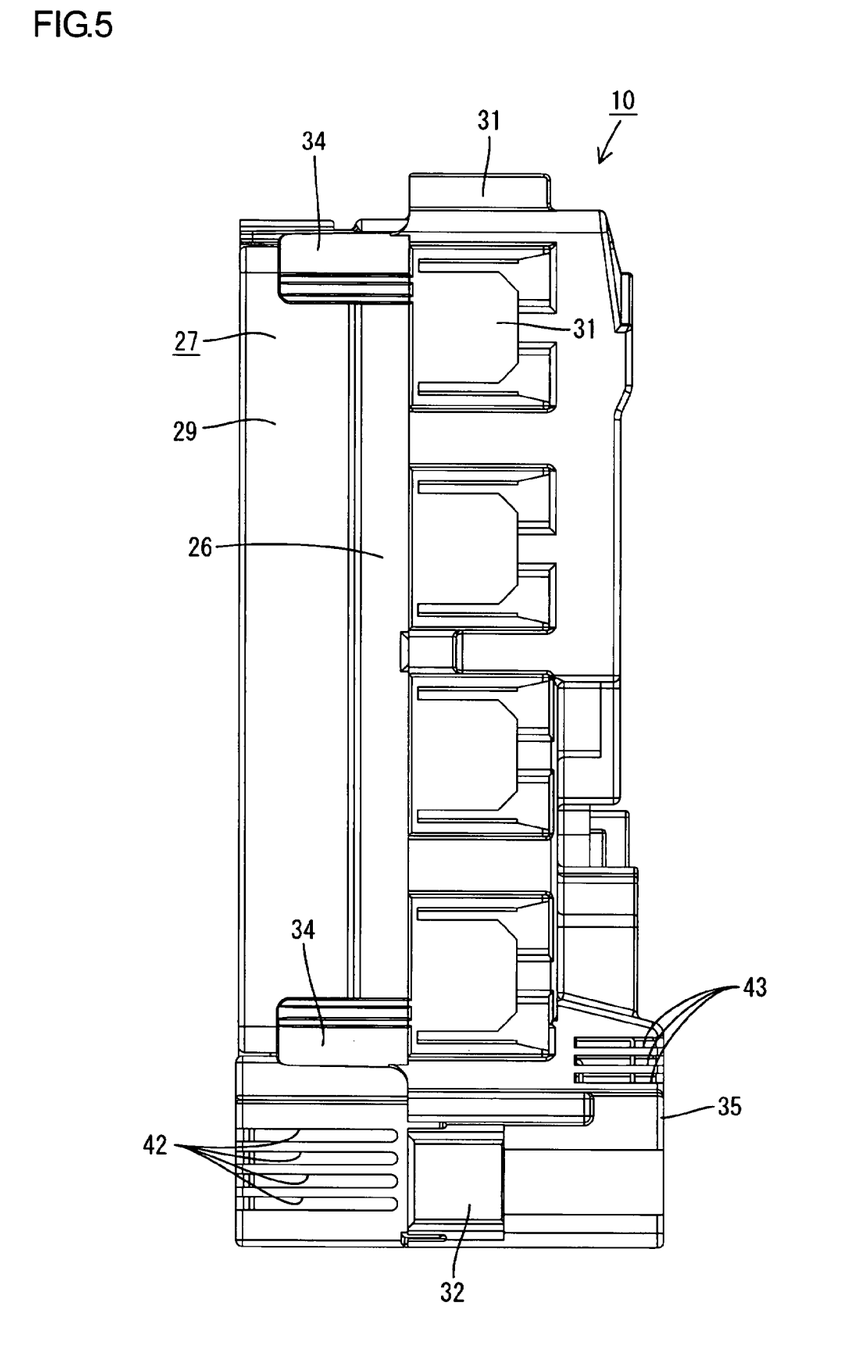
FIG. 5 shows a side view of an electric connection box according to one illustrative aspect of the present invention.
Figure 6:
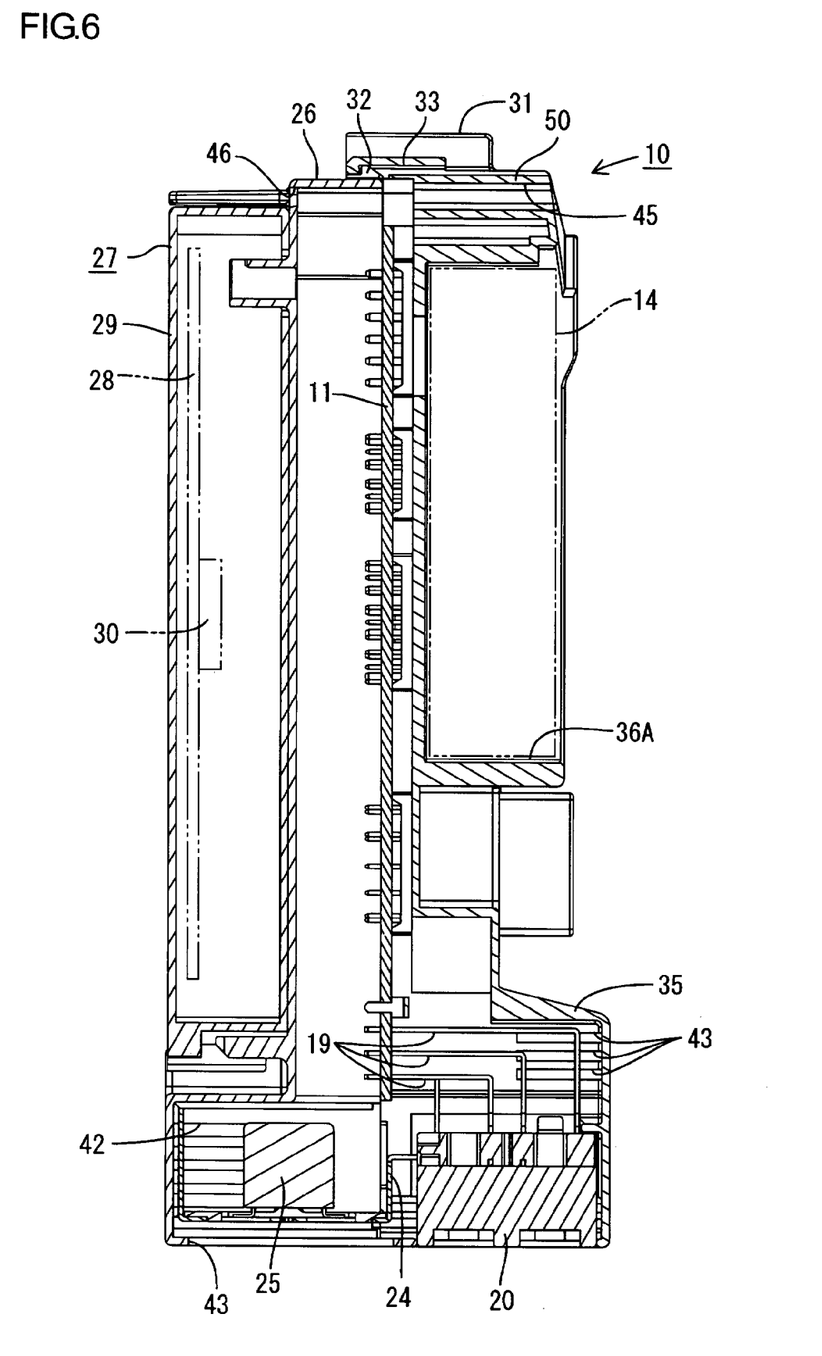
FIG. 6 shows a cross-sectional view taken along the line A-A in FIG. 3.

In the following, one illustrative aspect of the present invention is described in reference to FIGS. 1 to 8. An electric connection box according to the present illustrative aspect is mounted in between a battery (not shown) and a vehicle electrical component such as a lamp or a power window (not shown), and controls energizing of these vehicle electrical components. The electric connection box is mounted inside of a vehicle (not shown) in a longitudinal position as shown in FIG. 6 for use. This electric connection box is comprised of a circuit board 11 housed inside of a flat case 10.

Circuit Board

On the both surfaces of the circuit board 11 having a nearly-oblong shape, an electrically-conducting path (not shown) is formed by printed wiring technology. On the right surface of the circuit board 11 in FIG. 7 (hereinafter referred to as 'mounting surface' in some cases), an intermittent relay 12 (corresponding to the electronic component in the present invention) is mounted. The intermittent relay is for conducting turn-on and cutoff the electricity for vehicle electrical components, that are used intermittently (not shown), such as a fog lamp and a door lock. Also, on the mounting surface of the circuit board 11, a resistance 13 (corresponding to the electronic component according to the present invention) for preventing back EMF of the intermittent relay 12 is mounted. Moreover, on the mounting surface of the circuit board 11, a male tab 17 (male terminal), which connects with a connector 14 (corresponding to the electrical component according to the present invention) for connecting with an external circuit, is attached via a male tab seat 18.

Figure 7:
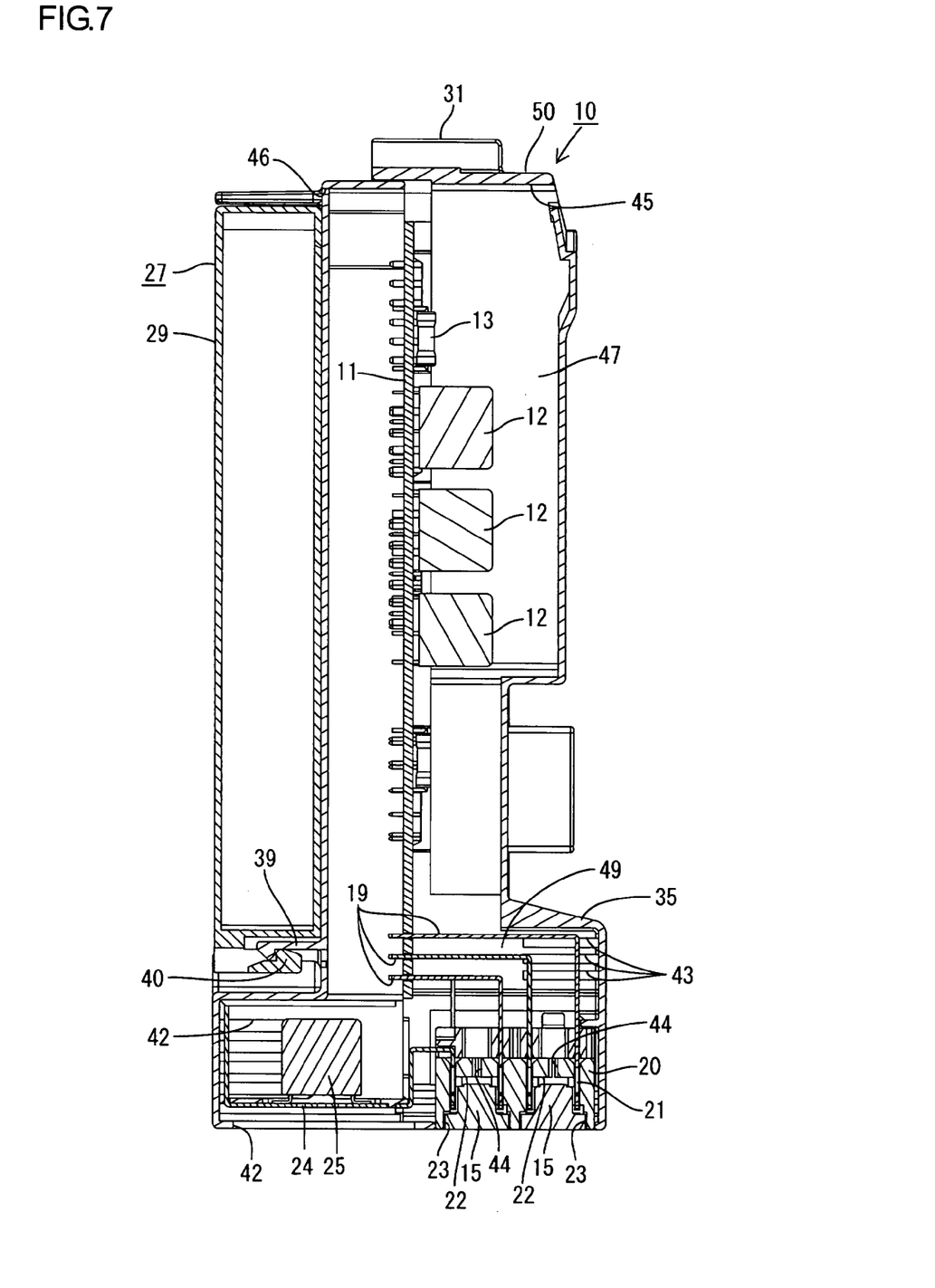
FIG. 7 shows a cross-sectional view taken along the line B-B in FIG. 3.

As shown in FIGS. 6 and 7, one ends of a plurality of terminal fittings 19 are mounted in the lower end of the circuit board 11, as penetrating there through. The other ends of these terminal fittings 19 are folded downwardly into a nearly-L-shape, then attached to a fuse block 20 to be described. The other end of the terminal fitting 19 is a fuse terminal 21 to which a fuse 15 (corresponding to the heat generating component in the present invention) is attached.

As shown in FIG. 6, the fuse block 20 is made of synthetic resin, having a nearly oblong shape. The bottom surface of the fuse block 20 constructs a part of the case 10, and is exposed to the outside of the case 10. On the bottom surface of the fuse block 20, a fuse attaching member 22 is formed so as to be caved into upwardly according to FIG. 7, while an opening 23 that opens downwardly is also formed (corresponding to the opening in the present invention) thereon. The fuse terminal 21 of the above-mentioned terminal fitting 19 is facing inside of the fuse attaching member 22. As shown in FIG. 4, the fuse attaching members 22 are formed so as to be arrayed side by side in a horizontal direction according to FIG. 4, and at the same time, arrayed also up and down (arrayed in two levels in the present illustrative aspect) according to FIG. 4. And also, in the fuse block 20, a fuse block inlet 70 (corresponding to the inlet in the present invention) is provided in between adjacent fuse attaching members 22 as penetrating through the bottom wall of the fuse block 20. The fuse block inlet 70 communicates the internal space of the fuse housing member 35 with the external space thereof.

A bus bar 24 bent in a nearly-S-shape when viewed from the side is attached to the fuse attaching member 22 positioned in the left side in FIG. 7, with its right end faced inside of the fuse attaching member 22. The bus bar 24 is electrically connected to the circuit board 11 via the fuse 15 and the terminal fitting 19, as shown in FIG. 7. A plurality of relays 25 are connected to the bus bar 24.

An insulating film (not shown) is formed on the above-mentioned terminal fitting 19 and the bus bar 24 except the connecting part with the fuse 15 and with the relay 25. This prevents short-circuit between the terminal fittings 19 as well as between the bus bars 24, even though dust is adhered in a manner of striding across the adjacent terminal fittings 19, and across the adjacent bus bars 24.

Though no details are illustrated in the figures, a trunk terminal (not shown) for connecting with an ECU (Electrical Control Unit) 27 to be described is attached on a non-mounting surface (the left surface in FIG. 6) of the upper end fringe of the circuit board 11.

Case

Figure 1:
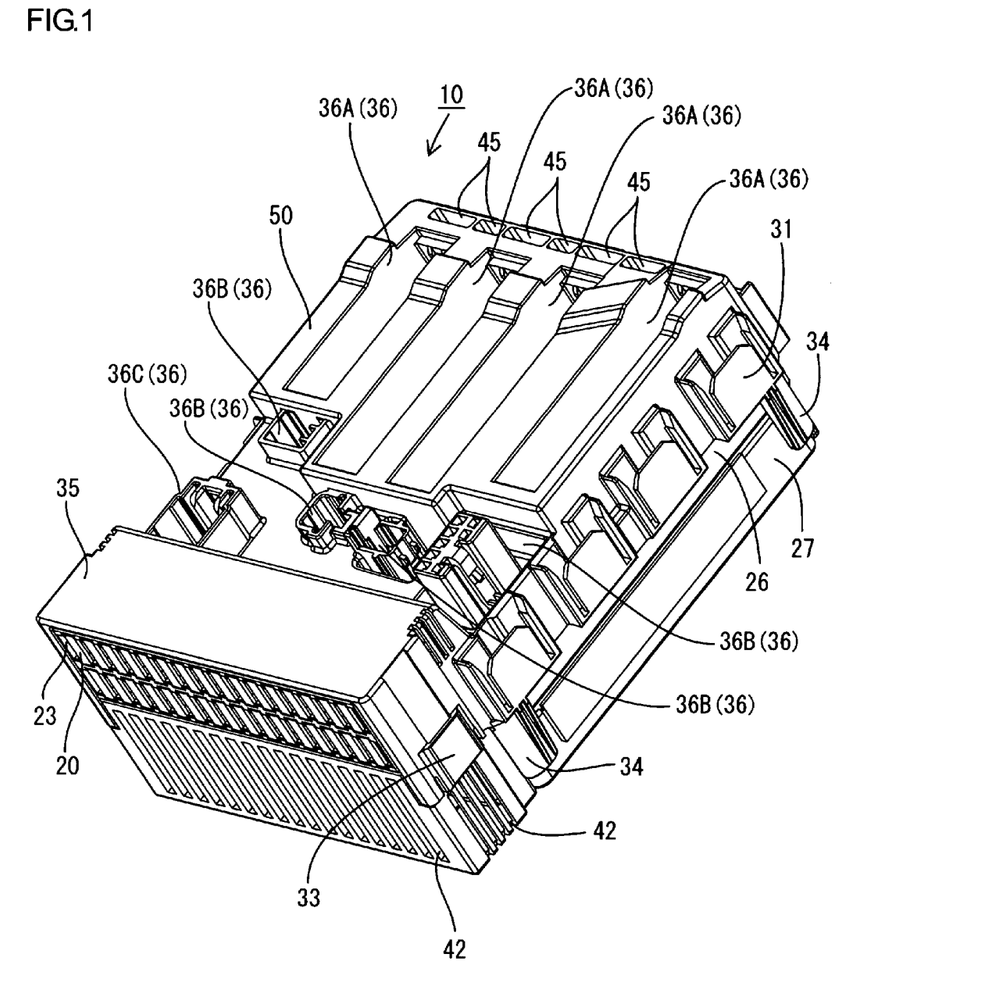
FIG. 1 shows a perspective view of an electric connection box according to one illustrative aspect of the present invention.
Figure 2:
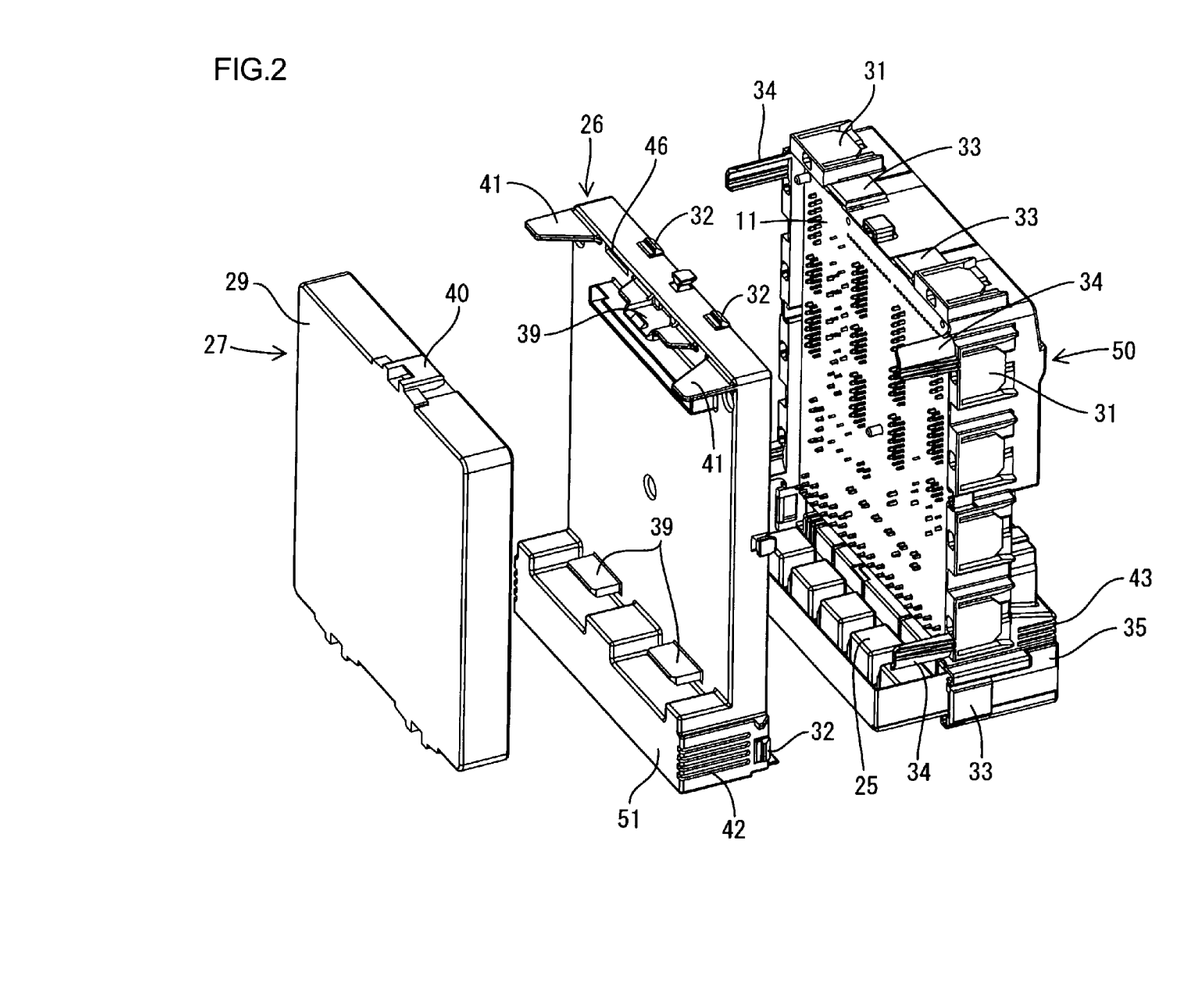
FIG. 2 shows an exploded perspective view of an electric connection box according to one illustrative aspect of the present invention.

As shown in FIG. 2, the case 10 is made of synthetic resin, and comprising a flat case body 50 for housing the circuit board 11 as well as a cover 26 for covering the opening surface of the case body 50. The ECU 27 is attached on the cover 26's surface that is opposite to the case body 50.

The ECU 27 comprises a ECU circuit board 28 (indicated with a dashed-two dotted line in FIG. 6) housed inside of a ECU case 29. A microcomputer 30 (indicated with a dashed-two dotted line in FIG. 6) is mounted in the ECU circuit board 28, and thereby forming such as a driving circuit of the intermittent relay 12. The ECU circuit board 28 and the circuit board 11 are connected with the trunk terminal provided so as to penetrate through the cover 26 and the ECU case 29.

The case body 50 has a shape of a shallow container, so that the circuit board 11 is housed there inside. A vehicle body lock member 31 for attaching the electric connection box to the vehicle body of a vehicle is provided on the outer surface of the side wall of the case body 50. Also, on the upper and the side surfaces of the case body 50 in FIG. 2, a lock receiver 33 is provided for resiliently engaging with the lock protrusion 32 provided on the upper and the side surfaces of the cover 26. The engagement between the lock receiver 33 and the lock protrusion 32 integrates the case body 50 and the cover 26.

The lower end of the case body 50 is bulged out to the right direction in FIG. 6, thereby forming the fuse housing member 35 for housing the above-mentioned fuse block 20. The lower end of the fuse housing member 35 opens downwardly, and the fuse block 20 is attached inside of this opening 23. As shown in FIG. 6, the opening edge in the lower side of the fuse housing member 35 and the outer surface of the bottom of the fuse block 20 are formed so as to be a nearly-one surface.

On the right wall of the case body 50 in FIG. 6, a connector fitting 36 (corresponding to the fitting depression in the present invention) for attaching the connector 14 is provided so as to be depressed toward the circuit board 11's side (to the left in FIG. 6).

Figure 3:
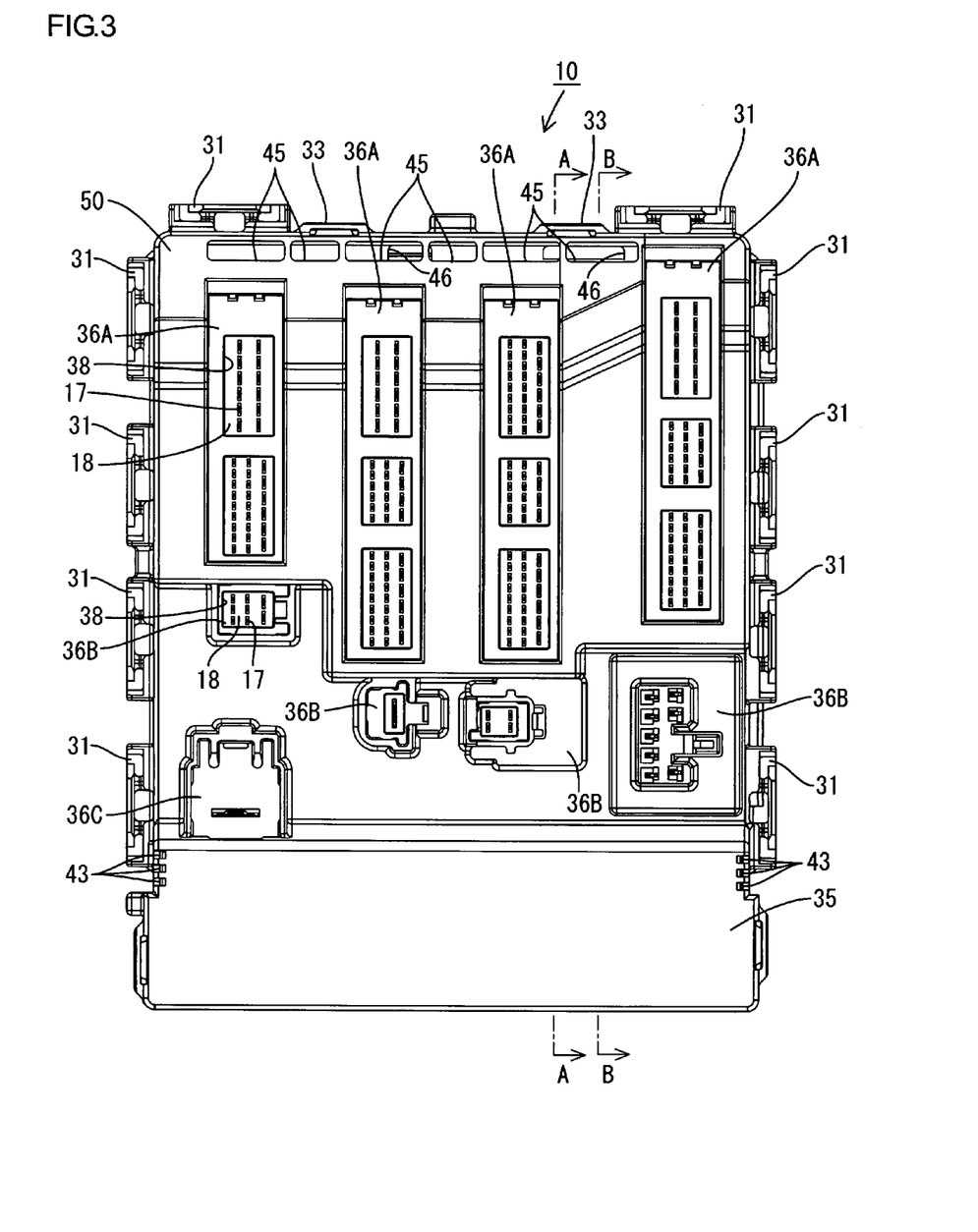
FIG. 3 shows an elevation view of an electric connection box according to one illustrative aspect of the present invention.
Figure 8:
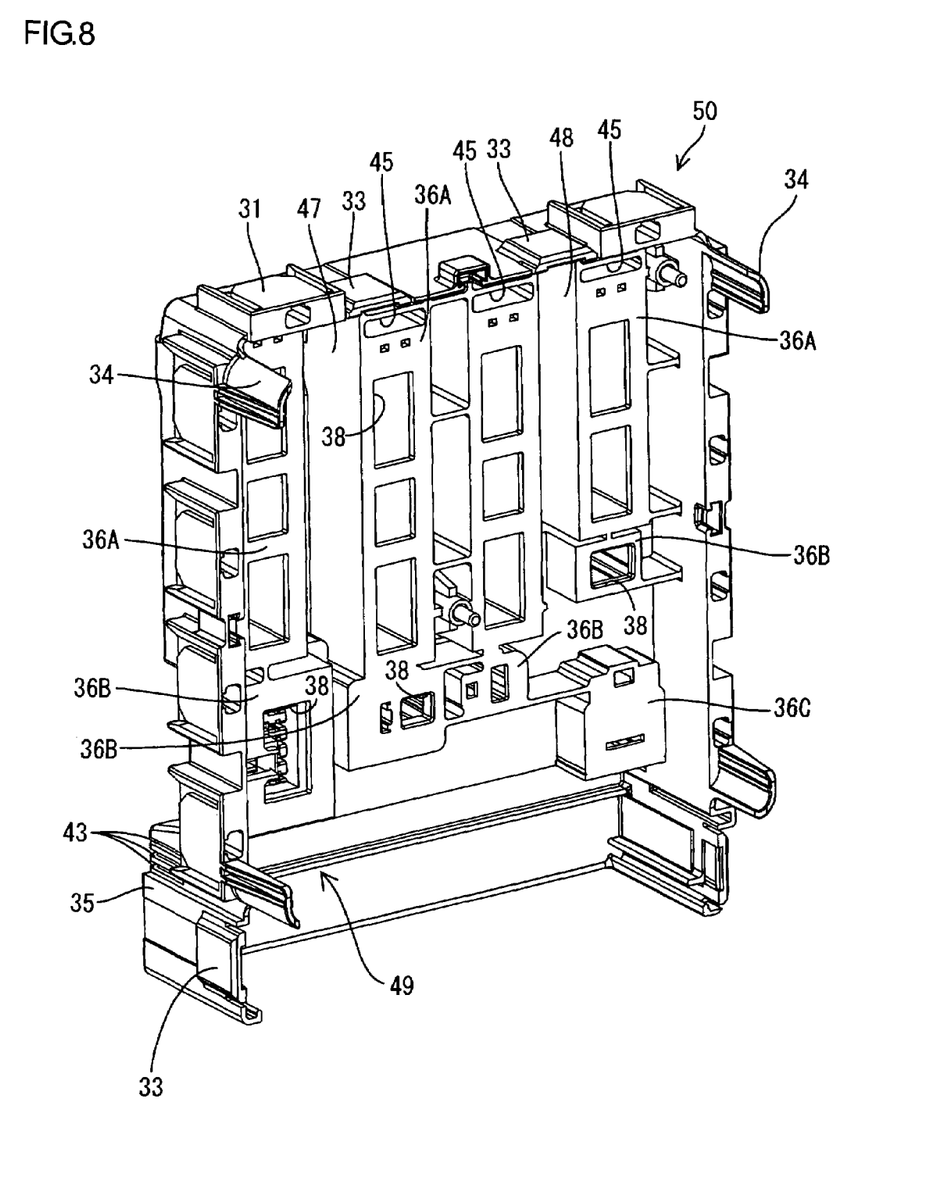
FIG. 8 shows a back view of a case body according to one illustrative aspect of the present invention.

As shown in FIG. 3, the upper connector fitting 36A formed in the upper side of the case body 50 is extended vertically up and down, and at the same time, a plurality of the same (four in the present illustrative aspect) are horizontally arrayed with a spacing in between. In the lower position of each of these upper connector fittings 36A, a plurality of lower connector fittings 36B (four in the present illustrative aspect) are formed so as to be arrayed in the right and the left direction in FIG. 3 with a spacing in between. Moreover, on the lower side which is positioned at the left end in FIG. 3 and down from the lower connector fitting 36B, a power connector fitting 36C for connecting with a power line for the battery (not shown) is formed. As shown in FIG. 8, a window 38 is opened on the back wall of the upper, the lower, and the power connector fittings 36A, 36B, and 36C. The above-mentioned male tabs 17 and the male tab seats 18 are facing to the upper, the lower, and the power connector fittings 36A, 36B and 36C (see FIG. 3) from the window 38.

As shown in FIG. 2, the cover 26 has a shallow plate shape, so as to cover the opening surface of the case body 50. As shown in FIG. 2, on the upper and the side walls of the cover 26, a lock protrusion 32 is formed for engaging with the lock receiver 33 of the case body 50. And also, on the cover 26's wall opposing to the ECU 27, a lock 39 with elastic flexibility is formed as protruding toward the ECU 27. The lock 39 engages with the lock receiver 40 formed in the ECU 27, so that the cover 26 and the ECU 27 integrate together.

In addition, as shown in FIG. 2, on the cover 26's wall surface opposing to the ECU 27, a plate-like guide 41 protruding toward the ECU 27 is formed. When the cover 26 and the ECU 27 are assembled, the ECU 27 is guided to the qualified assembling position by the guide 41 as a result of the abrading contact between the guide 41 and the outer surface of the ECU case 29 of the ECU 27. Furthermore, four guides 34 extending toward the cover 26 are provided in the four corners on the opening surface of the case body 50. When assembling the case body 50 with the cover 26 and the ECU 27, the outer surface of the position corresponding to the guide 34 in the cover 26 and the ECU 27 abrades with the inner surface of the guide 34. This guides the cover 26 and the ECU 27 to the qualified assembling position. Meanwhile, the case body 50 and the cover 26 may be assembled together before the ECU 27 is assembled.

As shown in the FIG. 6, the lower end of the cover 26 is bulged out to the left in FIG. 6, and thus forms a relay housing member 51 for housing the above-mentioned relay 25. As shown in FIG. 6, the outer surface of the bottom wall of the relay housing member 51 and the outer surface of the bottom of the fuse block 20 in the case body 50 are formed so as to be one surface. And also, as shown in FIG. 5, an air hole 42 extending to the right and the left in FIG. 5 is formed and arrayed up and down on the side wall of the relay housing member 51. Also, as shown in FIG. 4, the air hole 42 is formed so as to extend to the right and the left in FIG. 4 on the bottom wall of the fuse block 20. The external air inflowing from these air holes 42 cools the relay 25.

As shown in FIG. 5, in the upper part of the fuse housing member 35 in the case body 50, an inlet in the housing member 43 is formed so as to extend to the right and the left in FIG. 5. This inlet in the housing member 43 allows the external air to inflow inside of the case 10. And as shown in FIG. 7, a through-hole 44 vertically penetrating through in FIG. 7 is formed on the back wall of each fuse attaching member 22 in the fuse block 20. As mentioned above, the fuse attaching member 22 is formed so as to be opened downwardly, allowing the external air to inflow inside of the case 10 via the through-hole 44.

On the other hand, as shown in FIG. 7, an exhaust outlet in the case body 45 is formed in the position closer to the upper end of the right wall in FIG. 7, so as to be opened to the right direction. This exhaust outlet in the case body 45 allows the air to outflow from the inside of case 10 to the outside thereof. As shown in FIG. 3, the exhaust outlet in the case body 45 is formed in the position closer to the upper end of the side wall of the case body 50, so as to be extended horizontally in FIG. 3 and arrayed side by side with a spacing in between. Additionally, as shown in FIG. 7, an exhaust outlet in the cover 46 is formed in the position in the cover wall which is closer to the upper end of the side wall opposing to the circuit board 11. This exhaust outlet in the cover 46 is opened to the left as penetrating through the cover 26. This exhaust outlet in the cover 46 allows the air to outflow from the inside of case 10 to the outside thereof.

On the wall surface in the case body 50 opposing to the circuit board 11, the above-mentioned upper connector fitting 36A, the lower connector fitting 36B, and the power connector fitting 36C are formed so as to be caved into the circuit board 11 side (corresponding to the front side in FIG. 8). This forms a plurality of unevenness on the wall surface in the case body, said surface opposing to the circuit board 11.

These unevenness form a spacing extending up and down in between the upper connector fitting 36A and the lower connector fitting 36B positioned in the very left end, as well as between the upper connector fitting 36A and the lower connector fitting 36B positioned in the second from the left in FIG. 8. This spacing forms a first air path 47 capable of circulating the air up and down. The above-mentioned intermittent relay 12 and the resistance 13 are placed inside of the above-mentioned first air path 47.

And also, a spacing extending up and down are formed in between, the upper connector fitting 36A and the lower connector fitting 36B positioned in the very right end, and the upper connector fitting 36A positioned in the second from the right in FIG. 8. The lower end of this spacing extending up and down continues into the spacing horizontally extending, and surrounded by the lower end fringe of the lower connector fitting 36B positioned in the very right end and the upper end fringe of the power connector fitting 36C. The right end of this spacing extending horizontally continues into the spacing extending vertically and surrounded by the right wall of the case body 50 in FIG. 8 and the power connector fitting 36C. This forms a second air path 48 capable of circulating the air up and down on the whole.

The upper end of the first and the second air paths 47 and 48 continue into the above-mentioned exhaust outlet in the case body 45. In addition, as shown in FIGS. 6 and 7, the spacing inside of the case 10 communicates at the above from the upper end fringe of the circuit board 11, while the upper ends of the first and the second air paths 47 and 48 communicate also with the above-mentioned exhaust outlet in the cover 46.

On the other hand, as shown in FIG. 8, the lower ends of the first and the second air paths 47 and 48 continue into the spacing inside of the fuse housing member 35, so that this spacing constructs a lower air path 49. The above-mentioned terminal fitting 19 is exposed to the inside of the lower air path 49. And then, as shown in FIG. 7, the inlet in the housing member 43 formed in the fuse housing member 35 continues into the lower air path 49. Furthermore, the through-hole 44 formed in the fuse block 20 continues into the lower portion of the lower air path 49, and to the fuse attaching member 22. With the above, the fuse attaching member 22 constructs the lower air path 49, while the opening 23 in the lower side of the fuse attaching member 22 constructs the inlet according to the present invention. Additionally, the fuse block inlet 70 is formed in the fuse block 20, and continues into the spacing inside of the fuse housing member 35 (the lower air path 49).

The opening dimension of the exhaust outlet in the case body 45 and the exhaust outlet in the cover 46 are larger than that of the fuse block inlet 70, the inlet in the housing member 43, and the opening 23 in the fuse block 20.

In what follows, the working and the effect of the present illustrative aspect is described. When a vehicle electrical component is energized by the electric connection box, electrical current is supplied to the fuse 15. Then, the fuse 15 produces heat, and its temperature rises. The external air inflows from the opening 23 positioned in the lower side of the fuse attaching member 22 to the inside of the fuse attaching member 22 (the lower air path 49), and then contacts with the fuse 15 attached there inside. And the heat from the fuse 15 is transmitted to the air, and the temperature of the air rises. Then, the air density diminishes, allowing the air climbing up inside of the fuse attaching member 22, and the air inflows into the spacing inside of the fuse housing member 35 (the lower air path 49) from the through-hole 44.

And also, the heat produced from the fuse 15 is transmitted to the terminal fitting 19, which is connected with the fuse 15. The external air inflowing from the fuse block inlet 70 and the inlet in the housing member 43 to the spacing inside of the fuse housing member 35 (the lower air path 49) contacts with the terminal fitting 19, and the heat is transmitted from the terminal fitting 19. This causes the temperature of the air to rise.

The temperature of the air in the spacing inside of the fuse housing member 35 (the lower air path 49) rises since the heat from the fuse 15 and the terminal fitting 19 is transmitted thereto. This causes the air density to be diminished so that the air climbs up inside of the lower air path 49 from the chimney effect. The air is then moved to the first air path 47 or the second air path 48.

Firstly, the air moved to the first air path 47 climbs up there inside from the chimney effect, and then outflows to the outside of the case 10 from the exhaust outlet in the case body 45 and the exhaust outlet in the cover 46. This allows the heat produced from the fuse 15 to be efficiently diffused to the outside.

Also, the air proceeded into the second air path 48 rises up there inside from the chimney effect. Then, the air contacts with the intermittent relay 12 and the resistance 13 placed inside of the second air path 48, resulting in the transmittance of the heat produced from the intermittent relay 12 and the resistance 13 to the air. Since these intermittent relay 12 and the resistance 13 are intermittently energized, the total heating value thereof is less than that of the fuse 15, which is consistently supplied with electrical current. This prevents the temperature close to the fuse 15 to rise higher than that of the intermittent relay 12 and the resistance 13, and does not disturb the chimney effect.

The temperature climbed up inside of the second air path 48 from the chimney effect outflows to the outside of the case 10 from the exhaust outlet in the case body 45 and the exhaust outlet in the cover 46. This efficiently diffuses the heat produced from the fuse to the outside.

When such as the connector fitting 36 is formed on the wall surface of the case body 50 so as to be depressed toward the circuit board 11, unevenness is formed inside of the case 10. Consequently, even when the heat generating components such as the fuse 15 are tried to be cooled by circulating the air inside of the case 10, the air does not circulate efficiently, and thus sufficient cooling effect might not be obtained.

Considering the above, in the present illustrative aspect, the upper, the lower, and the power connector fittings 36A, 36B, and 36C are formed on the case body 50's wall surface so as to be depressed toward the circuit board 11, said surface opposing to the circuit board 11. This configuration forms the first, the second, and the lower air paths 47, 48, 49, which are capable of circulating the air up and down by utilizing the unevenness formed inside of the case 10. As a result, the air inflowing from the inlet in the housing member 43 and the opening 23 in the fuse block 20 contacts with the fuse 15 placed inside of the lower air path 49, and then the heat produced from the fuse 15 is transmitted to the air, thereby increasing the temperature of the air. This results in the air climbing up inside of the first and the second air paths 47 and 48 from the lower air path 49 for the chimney effect. The outflow of this air from the exhaust outlets in the case body 45 and the exhaust outlet in the cover 46 exhausts the heat produced from the fuse 15 to the outside of the case 10. Consequently, the radiation performance of the electric connection box can be improved.

Furthermore, the terminal fitting 19 is exposed to the lower air path 49 so that the heat produced from the fuse 15 is transmitted to the terminal fitting 19, before is transmitted to the air circulating in the lower air path 49. As mentioned above, the cooling efficiency of the fuse 15 can be improved since the terminal fitting 19 can be used as a heat releasing member.

The above-mentioned fuse 15 receives high current due to its connection with a power circuit. This increases its heating value quite large, thereby necessitating cooling of the fuse 15. According to the present illustrative aspect, the fuse 15 can be cooled efficiently. Furthermore, the fuse 15 is placed in the bottom of the case 10. It is known from the chimney effect that the larger the temperature difference between up and down is, the faster the current speed of the air becomes. In this view, the current speed of the air circulating through the first, the second, and the lower air paths 47, 48, and 49 according to the present illustrative aspect can become faster. This further improves the cooling efficiency of the fuse 15.

Moreover, the heat produced from the intermittent relay 12 and the resistance 13, which are mounted in the circuit board 11, is transmitted to the air circulating in the second air path 48, and then diffused to the outside of the case 10. This further improves the radiation performance of the electric connection box.

In addition, since both the intermittent relay 12 and the resistance 13 are energized intermittently, the total heating value is less than that of the fuse 15. The temperature of the air close to the intermittent relay 12 and the resistance 13 is therefore prevented to rise higher than that of the air close to the fuse 15. Thus, the chimney effect is not restrained.

Additionally, dust inflowing from the inlet in the housing member 43 and the opening 23 into the case 10 may be concerned. Such dust might trigger a short-circuit between the terminal fittings 19 when contacting with them in a manner of bridging the adjacent terminal fittings 19. According to the present illustrative aspect, an insulating film is formed on the terminal fitting 19, so that a short-circuit between the terminal fittings 19 is prevented even when the dust contacts with them in a manner of bridging the adjacent terminal fittings 19.

Also, the temperature of the air increases by absorbing the heat from the fuse 15, letting its volume to expand. The volume of the air at the exhaust outlet in the case body 45 and the exhaust outlet in the cover 46 is therefore more expanded than the volume of the air of when it inflows inside of the case 10 from the fuse block inlet 70, the inlet in the housing member 43, and the opening 23. What is concerned is, for example, when the opening dimension of the exhaust outlet in the case body 45 and the exhaust outlet in the cover 46, as well as the fuse block inlet 70, the inlet in the housing member 43, and the opening 23 are set to be the same, the air might not smoothly outflow from the exhaust outlet in the case body 45 and the exhaust outlet in the cover 46.

Here, according to the present illustrative aspect, the opening dimension of the exhaust outlet in the case body 45 and the exhaust outlet in the cover 46 is set larger than that of the fuse block inlet 70, the inlet in the housing member 43, and the opening 23. This enables the air to smoothly outflow from the exhaust outlet in the case body 45 and the exhaust outlet in the cover 46, even though its volume is expanded by absorbing the heat from the fuse 15.

And also, for example, placing the electric connection box down below a duct of an air conditioner is concerned to cause the water droplet condensed in the duct to drop on the electric connection box. In such cases, providing the exhaust outlet in the case body 45 and the exhaust outlet in the cover 46 on the upper wall of the case 10 might cause water droplet to enter from the exhaust outlet in the case body 45 and the exhaust outlet in the cover 46. According to the present illustrative aspect, the exhaust outlet in the case body 45 and the exhaust outlet in the cover 46 are formed on the side wall of the case 10 so as to be opened sideways, so that the water droplet dropping from above is prevented to enter inside of the case 10.

Other Illustrative Aspects

The present invention shall not be limited to the illustrative aspect described with reference to the above description and figures. For example, the following illustrative aspects are also included in the technical scope of the present invention.

1. In the illustrative aspect above, an electronic component such as the intermittent relay 12 is mounted only on the one surface of the circuit board 11, however, an electronic component may be mounted on both surfaces of the circuit board 11, so that an air path is formed on both surfaces of the circuit board 11.

2. In the illustrative aspect above, the exhaust outlet in the case body 45 and the exhaust outlet in the cover 46 are provided respectively on the side walls of the case body 50 and of the cover 26, however, these exhaust outlets may be provided on the upper surface of the case 10 when the electric connection box is placed in the position where water droplet will not drip on from above. And also, for example, an eave may be provided above these exhaust outlets, so that water droplet dropping from above is prevented to enter.

3. In the illustrative aspect above, the inlet in the housing member 43 is provided on the side wall of the fuse housing member 35, and moreover, the through-hole 44 in the fuse 15 member 35 is provided on the upper surface of the fuse block 20. However, the inlet may be provided only on the side wall of the fuse housing member 25, or only on the upper surface of the fuse block 20.

4. In the illustrative aspect above, the electronic component (e.g. the intermittent relay 12 and the resistance 13) mounted to the circuit board 11 is positioned inside of the second air path 46. However, the electronic component may not be positioned inside of an air path.

5. In the illustrative aspect above, the fuse 15 is employed as a heat generating component, however, any electronic components, such as an electromechanical relay and a semiconductor switching device which produce heat by being energized, may be employed. And also, the heat generating component may not be necessarily positioned in the bottom of the case 10, as much as it is positioned in any of the first air path 47, the second air path 48, or the lower air path 49.

6. In the illustrative aspect above, the opening dimension of the exhaust outlet in the case body 45 and the exhaust outlet in the cover 46 is set to be larger than those of the inlet in the housing member 43, and the opening 23. However, the opening dimension of the exhaust outlet in the case body 45 and the exhaust outlet in the cover 46 may be set to be the same as or smaller than that of the inlet in the housing member 43 or the opening 23.

7. A cover on the back of the exhausting direction of the exhaust outlet in the case body 45 and the exhaust outlet in the cover 46 may be provided for preventing water droplet and dust inflowing from the upper side of the case 10 to enter inside of the case 10 from the both exhaust outlets.

What is claimed is:

1. An electric connection box, comprising:
   a circuit board;
   a case inside of which said circuit board is housed in a longitudinal position;
   a plurality of fitting depressions capable of being fitted with an external electrical component, positioned on a side wall of said case opposing a board surface of said circuit board and depressed toward said circuit board;
   an air path inside of said case defined by said plurality of fitting depressions positioned as an arrayed side by side with a spacing in between, said air path circulating the air up and down between said plurality of fitting depressions;
   an inlet positioned in said case and in communication with said air path;
   an exhaust outlet positioned in said case in communication with said air path and positioned above said inlet; and
   a heat generating component positioned in said air path.

2. An electric connection box according to claim 1, wherein a plurality of electronic components are positioned in said air path and on said circuit board, and a total heating value of said plurality of electronic components is less than a total heating value of said heat generating component.

3. An electric connection box according to claim 2, wherein said heat generating component is a fuse.

4. An electric connection box according to claim 3, wherein a fuse block for attaching said fuse is positioned in the bottom of said case, and a terminal fitting capable of connecting to said fuse is attached to said fuse block, said terminal fitting protruding from said fuse block into said air path.

5. An electric connection box according to claim 4, wherein an insulating film is formed on said terminal fitting except on the connecting part with said fuse.

6. An electric connection box according to claim 5, wherein an opening dimension of said exhaust outlet is larger than an opening dimension said inlet.

7. An electric connection box according to claim 6, wherein said exhaust outlet is formed on the sidewall of said case defining a sideways opening.

8. An electric connection box according to claim 1, wherein said heat generating component is a fuse.

9. An electric connection box according to claim 8, wherein a fuse block for attaching said fuse is positioned in a bottom of said case, and a terminal fitting capable of connecting to said fuse is attached to said fuse block, said terminal fitting protruding from said fuse block into said air path.

10. An electric connection box according to claim 9, wherein an insulating film is formed on said terminal fitting except on the connecting part with said fuse.

11. An electric connection box according to claim 10, wherein an opening dimension of said exhaust outlet is larger than an opening dimension of said inlet.

12. An electric connection box according to claim 11, wherein said exhaust outlet is formed on the side wall of said case defining a sideways opening.

13. An electric connection box according to claim 1, wherein an opening dimension of said exhaust outlet is set to be larger than that of said inlet.

14. An electric connection box according to claim 13, wherein said exhaust outlet is formed on the side wall of said case so as to be opened sideways.

15. An electric connection box according to claim 1, wherein said exhaust outlet is formed on the side wall of said case so as to be opened sideways.

* * * * *